(12) United States Patent
Park et al.

(10) Patent No.: US 9,989,845 B2
(45) Date of Patent: Jun. 5, 2018

(54) IMPRINT LITHOGRAPHY METHOD, METHOD FOR MANUFACTURING MASTER TEMPLATE USING THE METHOD AND MASTER TEMPLATE MANUFACTURED BY THE METHOD

(71) Applicant: Samsung Display Co., Ltd., Yongin-si (KR)

(72) Inventors: Seung-Won Park, Seoul (KR); Dae-Hwan Jang, Seoul (KR); Min-Uk Kim, Seoul (KR); Jung-Gun Nam, Suwon-si (KR); Dae-Young Lee, Seoul (KR); Gug-Rae Jo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 7 days.

(21) Appl. No.: 14/991,828

(22) Filed: Jan. 8, 2016

(65) Prior Publication Data
US 2016/0306275 A1    Oct. 20, 2016

(30) Foreign Application Priority Data
Apr. 16, 2015  (KR) .................. 10-2015-0053800

(51) Int. Cl.
*C03C 15/00*    (2006.01)
*G03F 7/00*    (2006.01)

(52) U.S. Cl.
CPC ...... *G03F 7/0002* (2013.01); *B81C 2201/015* (2013.01)

(58) Field of Classification Search
CPC ........... H01L 21/0273; H01L 21/02318; H01L 21/3085; H01L 21/3086; H01L 21/30604;
(Continued)

(56) References Cited

U.S. PATENT DOCUMENTS 5,772,905 A    6/1998  Chou
8,647,106 B2 *  2/2014  Inanami .................. B32B 37/10
                                                    264/293
(Continued)

FOREIGN PATENT DOCUMENTS

KR    10-2014-0117425    10/2014

OTHER PUBLICATIONS

L Jay Gou, "Nonoimprint Lithography: Methods and Material Requirements", Advanced Materials, 2007, pp. 495-513, vol. 19.

*Primary Examiner* — Lan Vinh
(74) *Attorney, Agent, or Firm* — H.C. Park & Associates, PLC

(57) ABSTRACT

An exemplary embodiment discloses an imprint lithography method including: forming a first imprint pattern on a base substrate in a first area; forming a first resist pattern on the base substrate in a second area, the second area partially overlapping the first area; etching a third area using the first imprint pattern and the first resist pattern as an etch barrier, wherein the third area is a portion of the first area that is not overlapped with the second area; removing the first imprint pattern and the first resist pattern; forming a second imprint pattern on the base substrate in a fourth area which overlaps the second area and partially overlaps the third area; forming a second resist pattern on the base substrate in the third area; and etching the second area using the second imprint pattern and the second resist pattern as an etch barrier.

18 Claims, 21 Drawing Sheets

(58) Field of Classification Search
CPC ............. H01L 21/0002; H01L 21/0005; H01L 21/31144; B81C 2201/015
USPC ....... 438/706, 710, 712, 717, 719, 723, 725, 438/736; 216/41, 42, 44
See application file for complete search history.

(56) References Cited

U.S. PATENT DOCUMENTS

| | | |
|---|---|---|
| 8,703,406 B2 | 4/2014 | Schaper |
| 2009/0189306 A1* | 7/2009 | Terasaki .................. B82Y 10/00 264/238 |
| 2013/0153534 A1 | 6/2013 | Resnick et al. |
| 2014/0087016 A1* | 3/2014 | Gao ....................... G11B 5/855 425/470 |
| 2014/0202986 A1* | 7/2014 | Renaldo .................... G03F 7/24 216/41 |

* cited by examiner

IMPRINT LITHOGRAPHY METHOD, METHOD FOR MANUFACTURING MASTER TEMPLATE USING THE METHOD AND MASTER TEMPLATE MANUFACTURED BY THE METHOD

CROSS-REFERENCE TO RELATED APPLICATION

This application claims priority from and the benefit of Korean Patent Application No. 10-2015-0053800, filed on Apr. 16, 2015, which is hereby incorporated by reference for all purposes as if fully set forth herein.

BACKGROUND

Field

Exemplary embodiments relate to an imprint lithography method for a larger area process, a manufacturing method for a master template using the imprint lithography method, and a master template for an imprint lithography process manufactured by the manufacturing method.

Discussion of the Background

A cathode ray tube (CRT) display apparatus has been used due to its performance and competitive price. However the CRT display apparatus has relatively bulky size and less portability due to its weight. Therefore, a display apparatus such as a plasma display apparatus, a liquid crystal display apparatus and an organic light emitting display apparatus has been used due to its relatively smaller size, lighter weight, and lower power-consumption.

The liquid crystal display apparatus applies a voltage to specific molecular arrangement configured to change the molecular arrangement. The liquid crystal display apparatus displays an image using changes of optical property (for example, birefringence, rotatory polarization, dichroism, and light scattering) of a liquid crystal cell according to the changes of the molecular arrangement.

The liquid crystal display apparatus includes a polarizer to control arrangement of the liquid crystal molecules, a display panel, an optical sheet, and a backlight assembly. Recently, an in-cell polarizer structure, which includes a polarizer disposed inside the display panel, has been used as the polarizer. For example, a wire grid polarizer may be used. The wire grid polarizer may be formed by an imprint lithography process. However, the size of a master template for the imprint lithography process is limited, so that it is hard to manufacture a large display panel.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments provide an imprint lithography method for a large area process.

One or more exemplary embodiments also provide a manufacturing method for a master template using the imprint lithography method.

One or more exemplary embodiments also provide a master template for an imprint lithography process manufactured by the manufacturing method.

Additional aspects will be set forth in the detailed description which follows, and, in part, will be apparent from the disclosure, or may be learned by practice.

An exemplary embodiment discloses an imprint lithography method including: forming a first imprint pattern on a base substrate in a first area; forming a first resist pattern on the base substrate in a second area, the second area partially overlapping the first area; etching a third area using the first imprint pattern and the first resist pattern as an etch barrier, wherein the third area is a portion of the first area that is not overlapped with the second area; removing the first imprint pattern and the first resist pattern; forming a second imprint pattern on the base substrate in a fourth area which overlaps the second area and partially overlaps the third area; forming a second resist pattern on the base substrate in the third area; and etching the second area using the second imprint pattern and the second resist pattern as an etch barrier.

An exemplary embodiment also provides a manufacturing method of a master template for imprint lithography including: forming a first imprint pattern on a base substrate in a first area using an imprint mold; forming a first resist pattern on the substrate in a second area, the second area partially overlapping the first area; etching a third area using the first imprint pattern and the first resist pattern as an etch barrier, wherein the third area is a portion of the first area that is not overlapped with the second area; removing the first imprint pattern and the first resist pattern; forming a second imprint pattern on the base substrate in a fourth area which overlaps the second area and partially overlaps the third area; forming a second resist pattern on the base substrate in the third area; and etching the second area using the second imprint pattern and the second resist pattern as an etch barrier, and wherein the base substrate is larger than the imprint mold.

An exemplary embodiment further discloses a master template for an imprint lithography process including: a base substrate comprising a first area and a second area, the second area disposed adjacent to the first area; and a first layer disposed on the base substrate, the first layer comprising a fine pattern, wherein a diagonal length of a combination of the first area and the second area is larger than 300 mm (millimeter), and a width of a portion where the fine pattern is not uniformly formed at a boundary between the first area and the second area is less than an alignment error of photoresist process.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
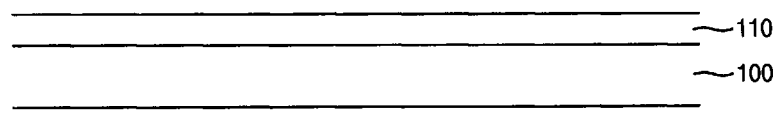
FIGS. 1A, 1B, 1C, 1D, 1E, 1F, 1G, 1H, 1I, 1J, and 1K are cross-sectional views illustrating an imprint lithography method according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1A, 1B, 1C, 1D, 1E, 1F, 1G, 1H, 1I, 1J, and 1K are cross-sectional views illustrating an imprint lithography method according to an exemplary embodiment.

Referring to FIG. 1A, a first may be formed or otherwise disposed on a base substrate 100. The base substrate 100 may include a material having relatively high transmittance, thermal resistance, and chemical resistance. For example, the base substrate 100 may include at least one of a glass substrate, a quartz substrate, a transparent resin substrate, etc. For example, the transparent resin substrate for the base substrate 100 may include at least one of polyimide-based resin, acryl-based resin, polyacrylate-based resin, polycarbonate-based resin, polyether-based resin, sulfonic acid containing resin, polyethylene terephthalate-based resin, etc.

The first layer 110 may include a transparent material which passes ultraviolet rays. For example, the first layer 110 may include a transparent silicon compound. For example, the first layer 110 may include at least one of silicon oxide ($SiO_X$), silicon nitride ($SiN_X$), silicon oxynitride ($SiO_XN_Y$), silicon oxycarbide ($SiO_XC_Y$), silicon carbon nitride ($SiC_XN_Y$), etc. The first layer 110 may also include at least one of aluminum (Al), titanium (Ti), copper (Cu), indium tin oxide (ITO), indium zinc oxide (IZO), etc.

The first layer 110 may be formed using a spin coating process, a chemical vapor deposition (CVD) process, a plasma enhanced chemical vapor deposition (PECVD) process, a high density plasma-chemical vapor deposition (HDP-CVD) process, a printing process, etc.

Figure 1B:
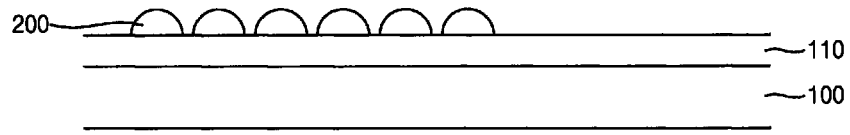

Referring to FIG. 1B, a first resin solution 200 may be formed or otherwise disposed on the first layer 110 in a first area A1. The first resin solution 200 may be may be provided in the form of a plurality of droplets on the first layer 110. For example, the first resin solution 200 may be dropped on the first layer 110 by an ink jet method. The first resin solution 200 may be an ultraviolet ray curable resin composition having a relatively low viscosity. The first area A1 may correspond to a portion of the base substrate 100. A first imprint process, which will be mentioned later, may be performed in the first area A1.

Figure 1C:
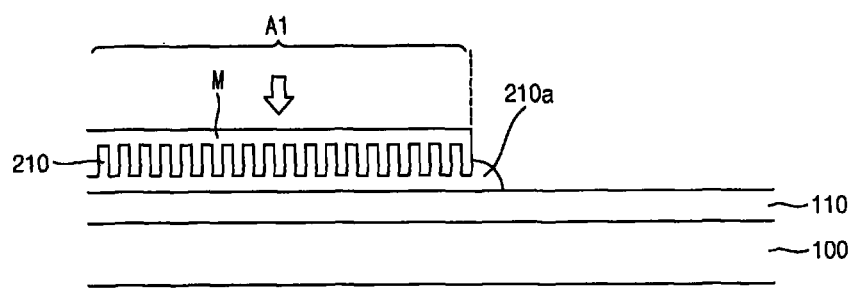

Referring to FIG. 1C, the first imprint process may be performed by moving an imprint mold M toward the base substrate 100, and the first resin solution 200 may be formed into a first preliminary pattern 210 by the imprint mold M. The first resin solution 200 has low viscosity, so the first preliminary pattern 210 may be formed between the imprint mold M and the base substrate 100 due to a capillary action.

The imprint mold M may have a mold pattern corresponding to the first area A1. The imprint mold M may include transparent material which may pass ultraviolet rays. The mold pattern may have an inverted shape of the first preliminary pattern 210. For example, the imprint mold M may have a pattern including protrusion pattern having same shape disposed in uniform distances corresponding to the first preliminary pattern 210 which corresponds to a wire grid pattern. The protrusion pattern may have pitch from about 50 nm (nanometer) to 150 nm. The pitch may be defined as a sum of a width of one protrusion pattern and a distance between adjacent protrusions.

The first resin solution 200 may be disposed in the first area A1, so that the first preliminary pattern 210 may be formed in the first area A1. During the first imprint process, a portion of the first resin solution 200 may be overflowed outside of the first area A1, forming a first overflowed portion 210a.

The first preliminary pattern 210 may include a residual layer disposed on the first layer 110, and a plurality of protrusions disposed on the residual layer. Each of the protrusions of the first preliminary pattern 210 may be formed between the protrusion patterns of the mold pattern of the imprint mold M.

The ultraviolet rays may be radiated to the first preliminary pattern 210, and the resin solution of the first preliminary pattern 210 may be hardened. The imprint mold M may pass the ultraviolet rays, so the ultraviolet rays may be radiated onto the first preliminary pattern 210 through the imprint mold M. Thus, the resin solution of the first preliminary pattern 210 may be hardened. The first preliminary pattern 210 may be formed by separating the imprint mold M from the base substrate 100.

Figure 1D:
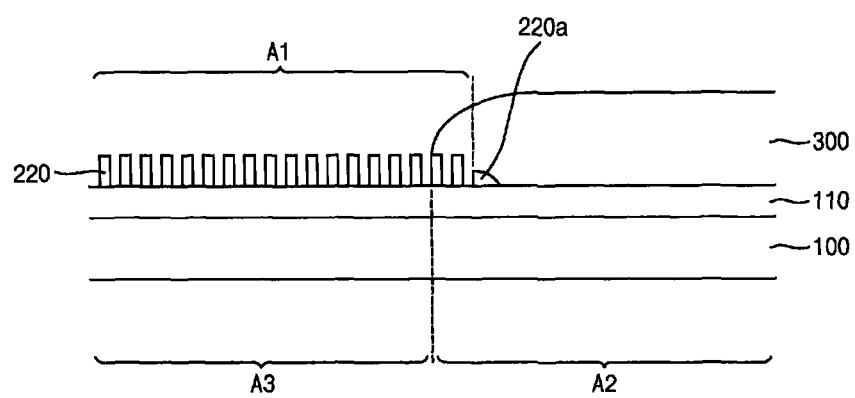

Referring to FIG. 1D, a first imprint pattern 220 may be formed by removing the residual layer of the first preliminary pattern 210. The first imprint pattern 220 may be formed in the first area A1. The first imprint pattern 220 may be formed by overall etching the first preliminary pattern 210 to remove the residual layer between the protrusions. The first overflowed portion 210a may also be partially removed during the etching process, so a first residual-overflowed portion 220a may be formed.

A first resist pattern 300 may be disposed in the second area A2 on the first layer 110, on which the first imprint pattern 220 is formed. The first resist pattern 300 may cover a portion of the first imprint pattern 220 at a boundary of the first area A1 and the first residual-overflowed portion 220a. The second area A2 may be disposed adjacent to the first area A1, and a boundary of the second area A2 may overlap the boundary of the first area A1. Thus, the second area A2 may partially overlap the first area A1.

The first resist pattern 300 may be formed by disposing a photoresist layer on the first layer 110, on which the first imprint pattern 220 is formed, and by exposing and developing the photoresist layer using an additional mask configured to leave a portion of the photoresist layer corresponding to the second area A2. For example, novolac photoresist may be used to form the first resist pattern 300. The first resist pattern 300 may have a thickness about 0.5 μm (micrometer) to about 4 μm. Accordingly, the first imprint pattern 220 in a third area A3 may be exposed. The third area A3 is a portion of the first area A1 that does not overlap the second area A2.

Figure 1E:
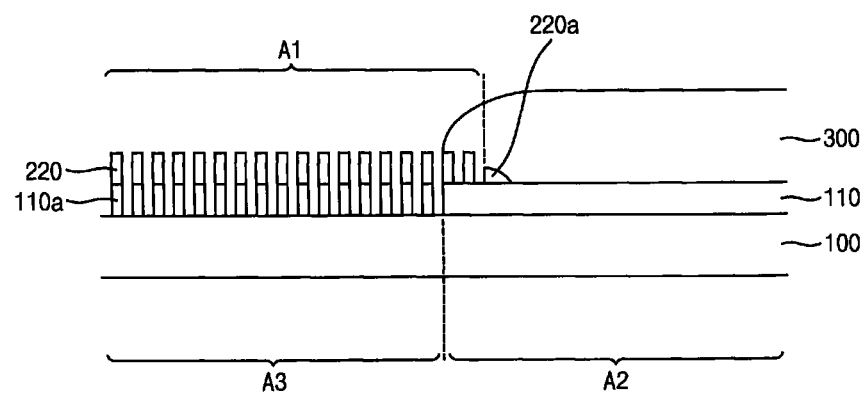

Referring to FIG. 1E, the first layer 110 may be partially removed using the first imprint pattern 220 and the first resist pattern 300 as a mask. Accordingly, a first layer pattern 110a may be formed in the third area A3. For example, the first layer 110 may be dry etched using the first imprint pattern 220 and the first resist pattern 300 as an etch barrier. Here, the first resist pattern 300 covers the second area A2, so a portion of the first layer 110 disposed in the second area A2 may be remained, and the first layer 110 disposed in the third area A3 may be patterned into the first layer pattern 110a. And then, the first imprint pattern 220 remaining in the third area A3 may be removed.

Figure 1F:
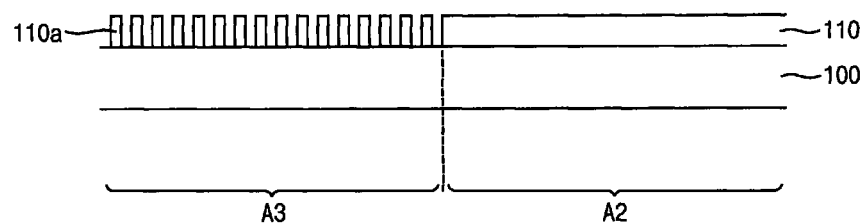

Referring to FIG. 1F, the first resist pattern 300, the first imprint pattern 220 remaining in the second area A2, and the first residual-overflowed portion 220a may be removed. Accordingly, the first layer 110 disposed in the second area A2 may be exposed.

Figure 1G:
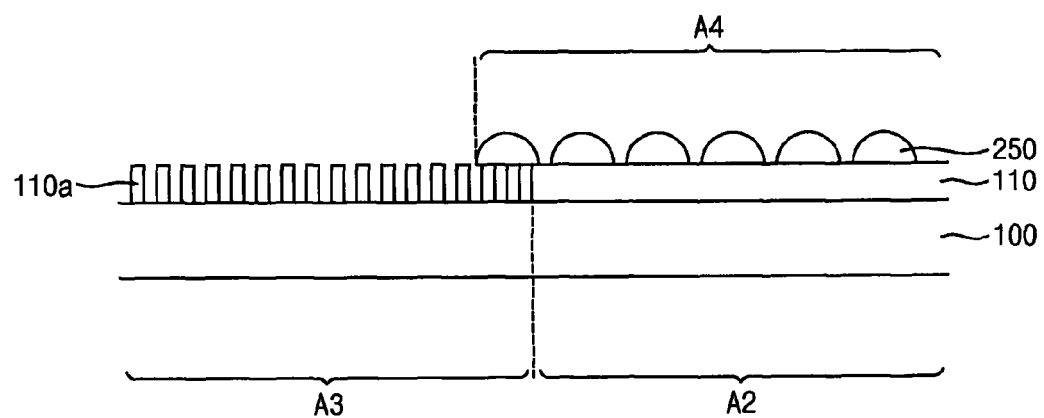

Referring to FIG. 1G, a second resin solution 250 may be formed or otherwise disposed on the first layer 110 in a fourth area A4. The second resin solution 250 may be disposed as a form of a plurality of droplets on the first layer 110. For example, the second resin solution 250 may be dropped on the first layer 110 by an ink jet method. The second resin solution 250 may be an ultraviolet ray curable resin composition having a relatively low viscosity.

The fourth area A4 may correspond to a portion of the base substrate 100. A second imprint process, which will be mentioned later, may be performed in the fourth area A4. The fourth area A4 may overlap the second area A2. A boundary of the fourth area A4 may overlap a boundary of the third area A3. Thus, the fourth area A4 may partially overlap the third area A3.

Figure 1H:
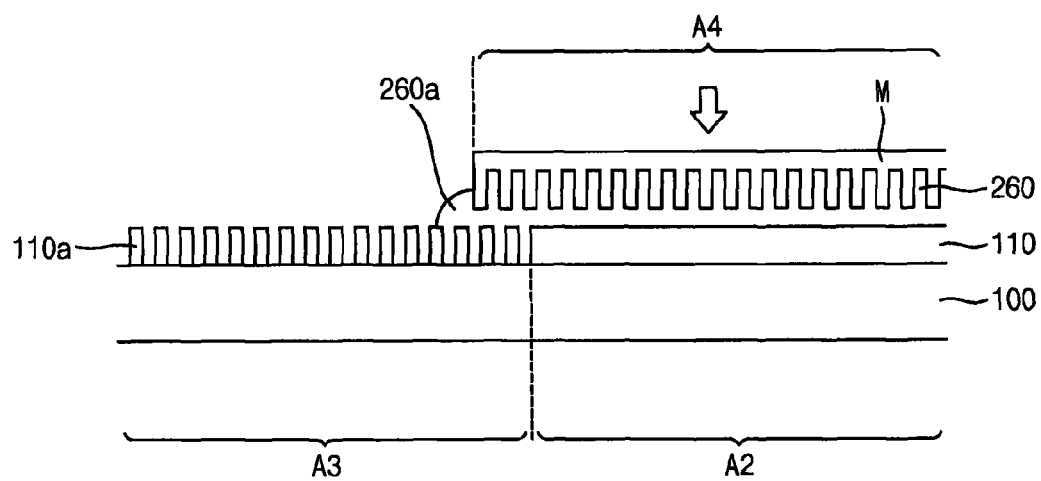

Referring to FIG. 1H, the second imprint process may be performed by moving the imprint mold M toward the base substrate 100, and the second resin solution 250 may be formed into a second preliminary pattern 260 by the imprint mold M. The second resin solution 250 has low viscosity, so the second preliminary pattern 260 may be formed between the imprint mold M and the base substrate 100 due to the capillary action.

The imprint mold M may be substantially same as the imprint mold M of the first imprint process. The imprint mold M may have a size smaller than a size of a traditional wafer (300 mm). Accordingly, sum of the third area A3 and the second area A2 may have a size larger than that of the traditional wafer.

The second resin solution 250 may be disposed in the fourth area A4, so that the second preliminary pattern 260 may be formed in the fourth area A4. During the second imprint process, a portion of the second resin solution 250 may be overflowed outside of the fourth area A4, forming a second overflowed portion 260a.

The second preliminary pattern 260 may include a residual layer disposed on the first layer 110, and a plurality of protrusions disposed on the residual layer. Each of the protrusions of the second preliminary pattern 260 may be formed between the protrusion patterns of the mold pattern of the imprint mold M.

The ultraviolet rays may be radiated to the second preliminary pattern 260, and the resin solution of the second preliminary pattern 260 may be hardened. The imprint mold M may pass the ultraviolet rays, so the ultraviolet rays may be radiated onto the second preliminary pattern 260 through the imprint mold M. Thus, the resin solution of the second preliminary pattern 260 may be hardened. The second preliminary pattern 260 may be formed by separating the imprint mold M from the base substrate 100.

Figure 1I:
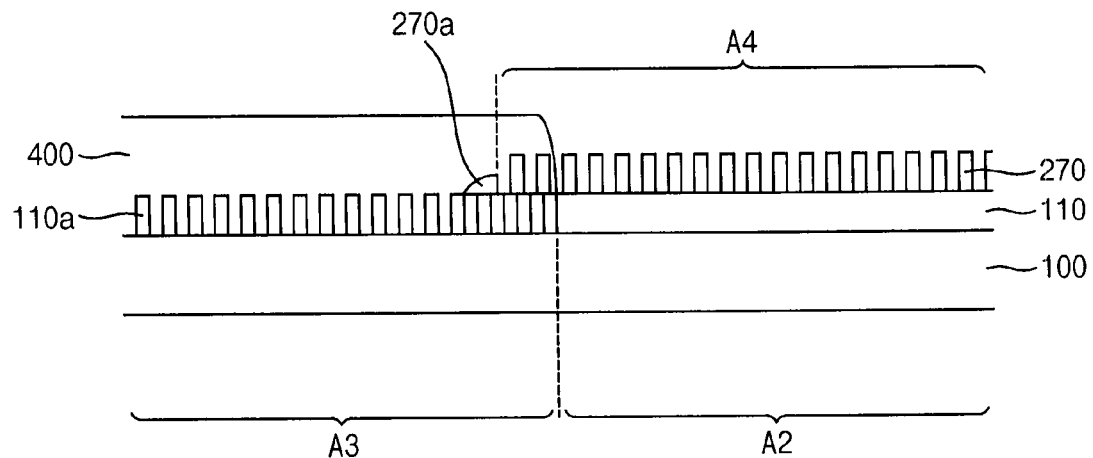

Referring to FIG. 1I, a second imprint pattern 270 may be formed by removing the residual layer of the second preliminary pattern 260. The second imprint pattern 270 may be formed in the fourth area A4. The second imprint pattern 270 may be formed by overall etching the second preliminary pattern 260 to remove the residual layer between the protrusions. The second overflowed portion 260a may also be partially removed during the etching process, so a second residual-overflowed portion 270a may be formed.

A second resist pattern 400 may be disposed in the third area A3 on the first layer 110, on which the second imprint pattern 270 is formed. The second resist pattern 400 may cover a portion of the second imprint pattern 270 at a boundary of the third area A3 and the second residual-overflowed portion 270a.

The second resist pattern 400 may be formed by disposing a photoresist layer on the first layer 110, on which the second imprint pattern 270 is formed, and by exposing and developing the photoresist layer using an additional mask configured to leave a portion of the photoresist layer corresponding to the third area A3. For example, novolac photoresist may be used to form the second resist pattern 400. The second resist pattern 400 may have a thickness about 0.5 μm (micrometer) to about 4 μm. Accordingly, the second imprint pattern 270 in the second area A2 may be exposed. A boundary of the second resist pattern 400 may be aligned to a boundary between the third area A3 and the second area A2 by a precise alignment process.

Here, an alignment error at the boundary of the second resist pattern 400 may rely on an accuracy of a photoresist process. For example, when misalignment tolerance of the photoresist process is 1.5 μm, a width of a stitch of the first layer pattern 110a at the boundary between the third area A3 and the second area A2, which will be mentioned later, may be less than 1.5 μm.

Figure 1J:
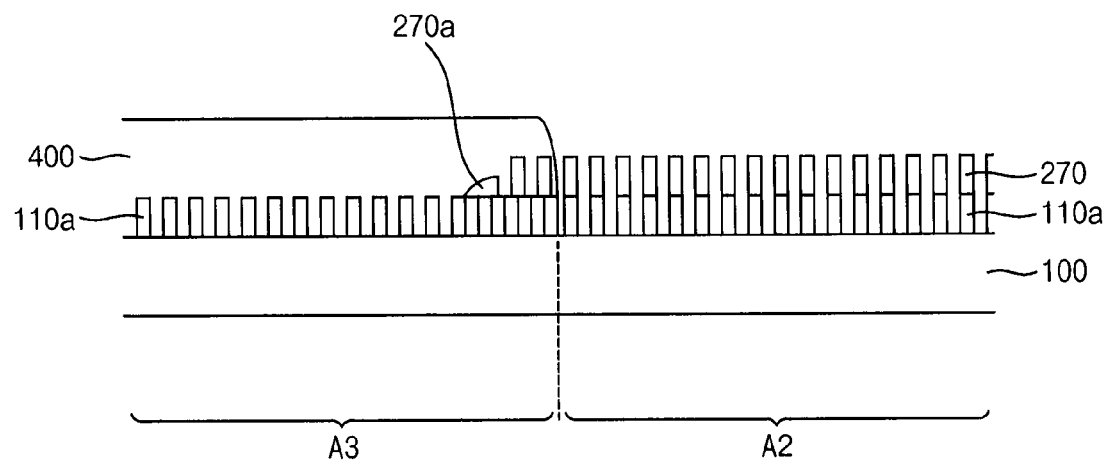

Referring to FIG. 1J, the first layer 110 may be partially removed using the second imprint pattern 270 and the second resist pattern 400 as a mask. Accordingly, a first layer pattern 110a may be formed in the second area A2. For example, the first layer 110 may be dry etched using the second imprint pattern 270 and the second resist pattern 400 as an etch barrier. Here, the second resist pattern 400 covers the third area A3, so a portion of the first layer 110 disposed in the third area A3 may be remained, and the first layer 110 disposed in the second area A2 may be patterned into the first layer pattern 110a. And then, the second imprint pattern 270 remaining in the second area A2 may be removed.

Figure 1K:
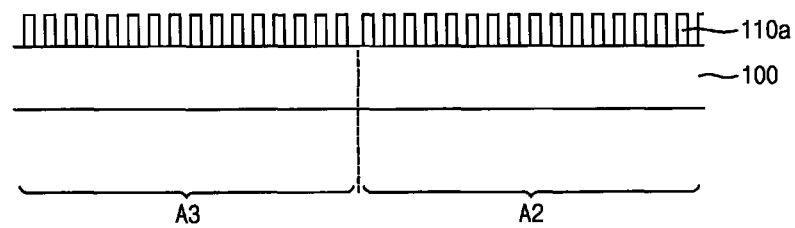

Referring to FIG. 1K, the second resist pattern 400, the second imprint pattern 270 remaining in the third area A3, and the second residual-overflowed portion 270a may be removed.

Accordingly, a master template for an imprint lithography process may be formed, which includes the first layer pattern 110a disposed on the base substrate 100. The master template may be used to perform a larger area imprint process which is larger than the imprint mold M. For example, the master template may be used to form an in-cell wire grid polarizer for a display panel.

Although the imprint mold M may generally have a size smaller than a traditional wafer (300 mm), the master template may have a size several times larger than the imprint mold M, and the large area imprint process may be performed using the master templet. Thus, the base substrate 100 of the master template may be larger than 300 mm.

During the first and second imprint processes, the boundary between the third area and the second area may be precisely aligned using a precise photoresist process. Thus, a pattern error at the boundary between the third area and the second area may be reduced.

In addition, the in-cell wire grid polarizer of a display apparatus may be directly formed using the exemplary method.

FIGS. 2A, 2B, 2C, 2D, 2R, 2F, 2G, 2H, and 2I are cross-sectional views illustrating an imprint lithography method according to an exemplary embodiment.

Figure 2A:
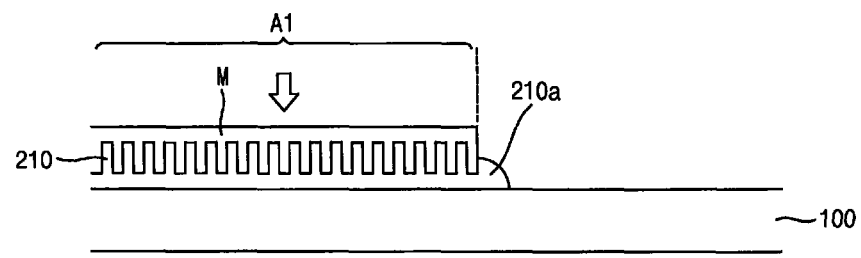
FIGS. 2A, 2B, 2C, 2D, 2E, 2F, 2G, 2H, and 2I are cross-sectional views illustrating an imprint lithography method according to an exemplary embodiment.

Referring to FIG. 2A, a first resin solution 200 may be formed or otherwise disposed on a base substrate 100 in a first area A1.

The base substrate 100 may include a material having relatively high light transmittance, thermal resistance, and chemical resistance. For example, the base substrate 100 may include at least one of a glass substrate, a quartz substrate, a transparent resin substrate, etc. Examples of the transparent resin substrate for the base substrate 100 may include at least one of polyimide-based resin, acryl-based resin, polyacrylate-based resin, polycarbonate-based resin, polyether-based resin, sulfonic acid containing resin, polyethylene terephthalate-based resin, etc.

The first resin solution 200 may be may be provided in the form of a plurality of droplets on the base substrate 100. For example, the first resin solution 200 may be dropped on the base substrate 100 by an ink jet method. The first resin solution 200 may be an ultraviolet ray curable resin composition having a relatively low viscosity. The first area A1 may correspond to a portion of the base substrate 100. A first imprint process, which will be mentioned later, may be performed in the first area A1.

And then, the first imprint process may be performed by moving an imprint mold M toward the base substrate 100, and the first resin solution 200 may be formed into a first preliminary pattern 210 by the imprint mold M. The first resin solution 200 has low viscosity, so the first preliminary pattern 210 may be formed between the imprint mold M and the base substrate 100 due to the capillary action.

The imprint mold M may have a mold pattern corresponding to the first area A1. The imprint mold M may include transparent material which may pass ultraviolet rays. The mold pattern may have an inverted shape of the first preliminary pattern 210. For example, the imprint mold M may have a pattern including protrusion pattern having same shape disposed in uniform distances corresponding to the first preliminary pattern 210 which corresponds to a wire grid pattern. The protrusion pattern may have pitch from about 50 nm (nanometer) to 150 nm. The pitch may be defined as a sum of a width of one protrusion pattern and a distance between adjacent protrusions.

The first resin solution 200 may be disposed in the first area A1, so that the first preliminary pattern 210 may be formed in the first area A1. During the first imprint process, a portion of the first resin solution 200 may be overflowed outside of the first area A1, forming a first overflowed portion 210a.

The first preliminary pattern 210 may include a residual layer disposed on the base substrate 100, and a plurality of protrusions disposed on the residual layer. Each of the protrusions of the first preliminary pattern 210 may be formed between the protrusion patterns of the mold pattern of the imprint mold M.

The ultraviolet rays may be radiated to the first preliminary pattern 210, and the resin solution of the first preliminary pattern 210 may be hardened. The imprint mold M may pass the ultraviolet rays, so the ultraviolet rays may be radiated onto the first preliminary pattern 210 through the imprint mold M. Thus, the resin solution of the first preliminary pattern 210 may be hardened. The first preliminary pattern 210 may be formed by separating the imprint mold M from the base substrate 100.

Figure 2B:
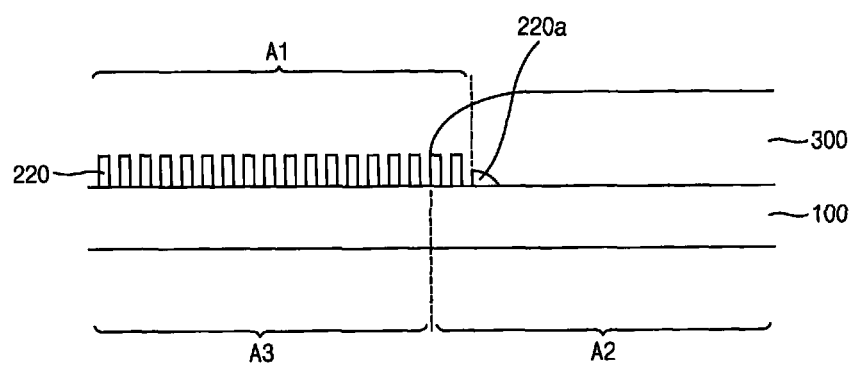

Referring to FIG. 2B, a first imprint pattern 220 may be formed by removing the residual layer of the first preliminary pattern 210. The first imprint pattern 220 may be formed in the first area A1. The first imprint pattern 220 may be formed by overall etching the first preliminary pattern 210 to remove the residual layer between the protrusions. The first overflowed portion 210a may also be partially removed during the etching process, so a first residual-overflowed portion 220a may be formed.

A first resist pattern 300 may be disposed in the second area A2 on the base substrate 100, on which the first imprint pattern 220 is formed. The first resist pattern 300 may cover a portion of the first imprint pattern 220 at a boundary of the first area A1 and the first residual-overflowed portion 220a. The second area A2 may be disposed adjacent to the first area A1, and a boundary of the second area A2 may overlap the boundary of the first area A1. Thus, the second area A2 may partially overlap the first area A1.

The first resist pattern 300 may be formed by disposing a photoresist layer on the base substrate 100, on which the first imprint pattern 220 is formed, and by exposing and developing the photoresist layer using an additional mask configured to leave a portion of the photoresist layer corresponding to the second area A2. For example, novolac photoresist may be used to form the first resist pattern 300. The first resist pattern 300 may have a thickness about 0.5 μm (micrometer) to about 4 μm. Accordingly, the first imprint pattern 220 in a third area A3 may be exposed. The third area A3 is a portion of the first area A1 that does not overlap the second area A2.

Figure 2C:
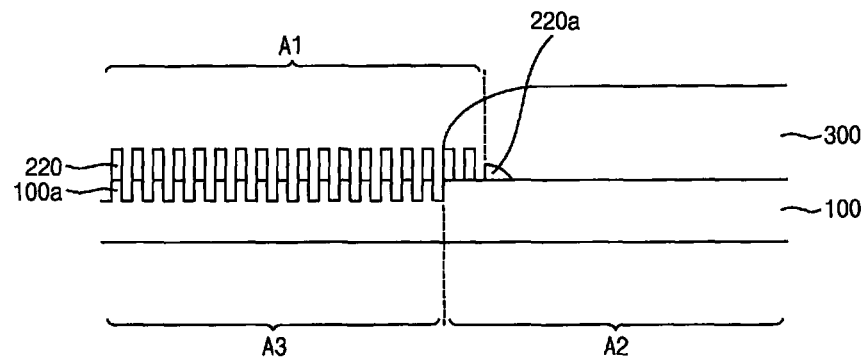

Referring to FIG. 2C, the base substrate 100 may be partially removed using the first imprint pattern 220 and the first resist pattern 300 as a mask. Accordingly, an engraved pattern 100a may be formed in the third area A3 by removing a portion of a surface of the base substrate 100. For example, the base substrate 100 may be dry etched using the first imprint pattern 220 and the first resist pattern 300 as an etch barrier. Here, the first resist pattern 300 covers the second area A2, so a portion of the base substrate 100 disposed in the second area A2 may be remained, and the base substrate 100 disposed in the third area A3 may be patterned into the engraved pattern 100a on the base substrate 100. And then, the first imprint pattern 220 remaining in the third area A3 may be removed.

Figure 2D:
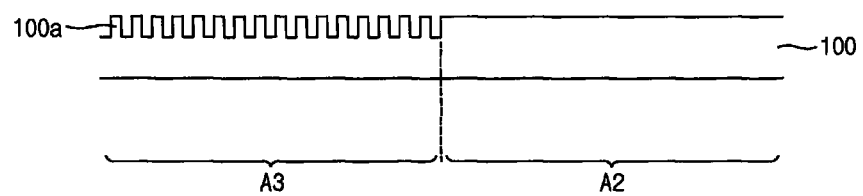

Referring to FIG. 2D, the first resist pattern 300, the first imprint pattern 220 remaining in the second area A2, and the first residual-overflowed portion 220a may be removed. Accordingly, the base substrate 100 disposed in the second area A2 may be exposed.

Figure 2E:
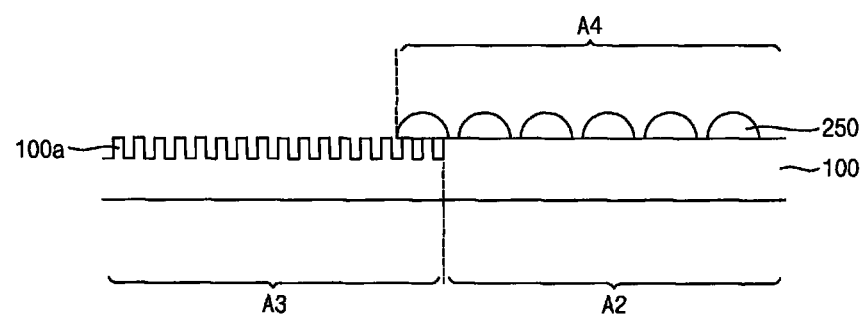

Referring to FIG. 2E, a second resin solution 250 may be disposed on the base substrate 100 in a fourth area A4. The second resin solution 250 may be disposed as a form of a plurality of droplets on the base substrate 100. For example, the second resin solution 250 may be dropped on the base substrate 100 by an ink jet method. The second resin solution 250 may be an ultraviolet ray curable resin composition having a relatively low viscosity.

The fourth area A4 may correspond to a portion of the base substrate 100. A second imprint process, which will be described later, may be performed in the fourth area A4. The fourth area A4 may overlap the second area A2. A boundary of the fourth area A4 may overlap a boundary of the third area A3. Thus, the fourth area A4 may partially overlap the third area A3.

Figure 2F:
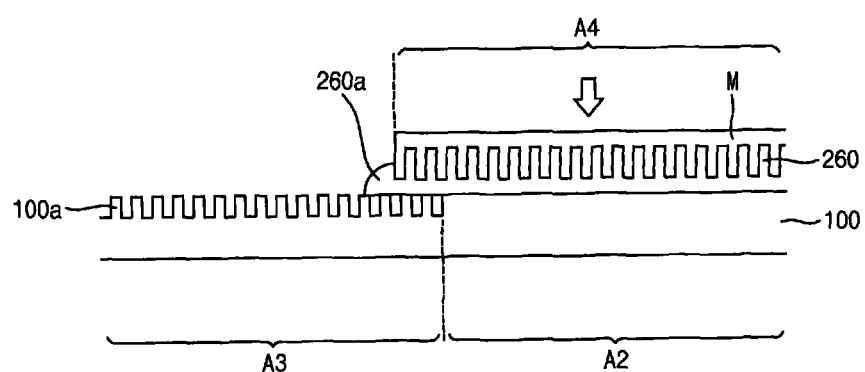

Referring to FIG. 2F, the second imprint process may be performed by moving the imprint mold M toward the base substrate 100, and the second resin solution 250 may be formed into a second preliminary pattern 260 by the imprint mold M. The second resin solution 250 has low viscosity, so the second preliminary pattern 260 may be formed between the imprint mold M and the base substrate 100 due to the capillary action.

The imprint mold M may be substantially same as the imprint mold M of the first imprint process. The imprint mold M may have a size smaller than a size of a traditional wafer (300 mm). Accordingly, sum of the third area A3 and the second area A2 may have a size larger than that of the traditional wafer.

The second resin solution 250 may be disposed in the fourth area A4, so that the second preliminary pattern 260 may be formed in the fourth area A4. During the second imprint process, a portion of the second resin solution 250 may be overflowed outside of the fourth area A4, forming a second overflowed portion 260a.

The second preliminary pattern 260 may include a residual layer disposed on the base substrate 100, and a plurality of protrusions disposed on the residual layer. Each of the protrusions of the second preliminary pattern 260 may be formed between the protrusion patterns of the mold pattern of the imprint mold M.

The ultraviolet rays may be radiated to the second preliminary pattern 260 such that the resin solution of the second preliminary pattern 260 may be hardened. The imprint mold M may pass the ultraviolet rays, so the ultraviolet rays may be radiated onto the second preliminary pattern 260 through the imprint mold M. Thus, the resin solution of the second preliminary pattern 260 may be hardened. The second preliminary pattern 260 may be formed by separating the imprint mold M from the base substrate 100.

Figure 2G:
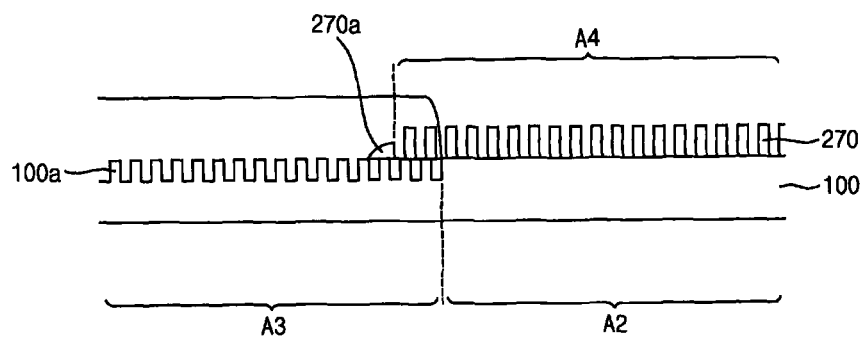

Referring to FIG. 2G, a second imprint pattern 270 may be formed by removing the residual layer of the second preliminary pattern 260. The second imprint pattern 270 may be formed in the fourth area A4. The second imprint pattern 270 may be formed by overall etching the second preliminary pattern 260 to remove the residual layer between the protrusions. The second overflowed portion 260a may also be partially removed during the etching process, so a second residual-overflowed portion 270a may be formed.

A second resist pattern 400 may be disposed in the third area A3 on the base substrate 100, on which the second imprint pattern 270 is formed. The second resist pattern 400 may cover a portion of the second imprint pattern 270 at a boundary of the third area A3 and the second residual-overflowed portion 270a.

The second resist pattern 400 may be formed by disposing a photoresist layer on the base substrate 100, on which the second imprint pattern 270 is formed, and by exposing and developing the photoresist layer using an additional mask configured to leave a portion of the photoresist layer corresponding to the third area A3. For example, novolac photoresist may be used to form the second resist pattern 400. The second resist pattern 400 may have a thickness about 0.5 µm (micrometer) to about 4 µm. Accordingly, the second imprint pattern 270 in the second area A2 may be exposed. A boundary of the second resist pattern 400 may be aligned to a boundary between the third area A3 and the second area A2 by a precise alignment process.

Figure 2H:
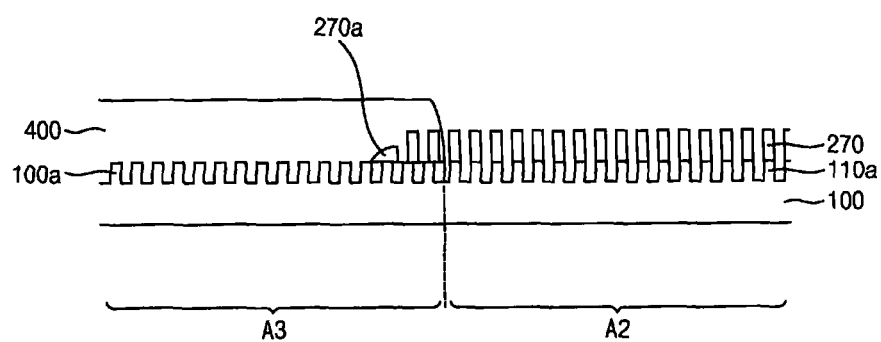

Referring to FIG. 2H, the base substrate 100 may be partially removed using the second imprint pattern 270 and the second resist pattern 400 as a mask. Accordingly, an engraved pattern 100a may be formed in the second area A2 by removing a portion of a surface of the base substrate 100. For example, the base substrate 100 may be dry etched using the second imprint pattern 270 and the second resist pattern 400 as an etch barrier. Here, the second resist pattern 400 covers the third area A3, so a portion of the first layer 110 disposed in the third area A3 may be remained, and the base substrate 100 disposed in the second area A2 may be patterned into the engraved pattern 100a on the base substrate 100. And then, the second imprint pattern 270 remaining in the second area A2 may be removed.

Figure 2I:
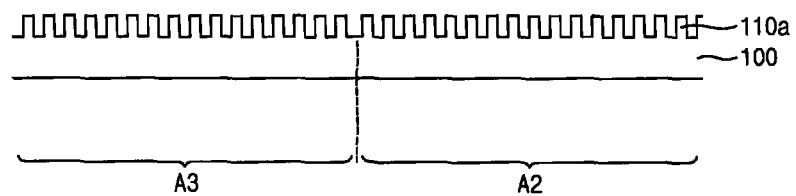

Referring to FIG. 2I, the second resist pattern 400, the second imprint pattern 270 remaining in the third area A3, and the second residual-overflowed portion 270a may be removed.

Accordingly, a master template for an imprint lithography process, which includes the engraved pattern 100a disposed on the base substrate 100, may be formed. In addition, an engraved pattern may be directly formed on a substrate by using the method.

FIGS. 3A, 3B, 3C, 3D, 3E, 3F, 3G, 3H, and 3I are cross-sectional views illustrating an imprint lithography method according to an exemplary embodiment.

Figure 3A:
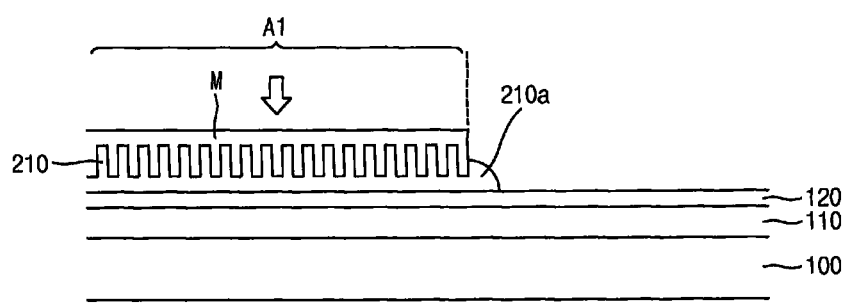
FIGS. 3A, 3B, 3C, 3D, 3E, 3F, 3G, 3H, and 3I are cross-sectional views illustrating an imprint lithography method according to an exemplary embodiment.

Referring to FIG. 3A, a first layer 110 may be formed or otherwise disposed on a base substrate 100. The base substrate 100 may include a material having relatively high transmittance, thermal resistance, and chemical resistance.

The first layer 110 may include a transparent material which passes ultraviolet rays. For example, the first layer 110 may include transparent silicon compound. For example, the first layer 110 may include at least one of silicon oxide ($SiO_X$), silicon nitride ($SiN_X$), silicon oxynitride ($SiO_XN_Y$), silicon oxycarbide ($SiO_XC_Y$), silicon carbon nitride ($SiC_XN_Y$), etc. The first layer 110 may also include at least one of aluminum (Al), titanium (Ti), copper (Cu), indium tin oxide (ITO), indium zinc oxide (IZO), etc.

The first layer 110 may be formed using a spin coating process, a chemical vapor deposition (CVD) process, a plasma enhanced chemical vapor deposition (PECVD) process, a high density plasma-chemical vapor deposition (HDP-CVD) process, a printing process, etc.

A mask layer 120 may be disposed on the first layer 110. The mask layer 120 may include a material having an etch rate lower than that of the first layer 110 in an etching condition of the first layer 110. For example, when the first layer 110 includes silicon oxide ($SiO_X$), the mask layer 120 may be a metal layer such as aluminum. When the first layer 110 includes aluminum, the mask layer 120 may include silicon oxide ($SiO_X$).

And then, a first resin solution 200 may be formed or otherwise disposed on the mask layer 120 in a first area A1. The first resin solution may be may be provided in the form of a plurality of droplets on the mask layer 120. For example, the first resin solution 200 may be dropped on the mask layer 120 by an ink jet method. The first resin solution 200 may be an ultraviolet ray curable resin composition having a relatively low viscosity.

The first area A1 may correspond to a portion of the base substrate 100. A first imprint process, which will be mentioned later, may be performed in the first area A1.

And then, the first imprint process may be performed by moving an imprint mold M toward the base substrate 100, and the first resin solution 200 may be formed into a first preliminary pattern 210 by the imprint mold M. The first resin solution has low viscosity, so the first preliminary pattern 210 may be formed between the imprint mold M and the base substrate 100 due to the capillary action.

The imprint mold M may have a mold pattern corresponding to the first area A1. The imprint mold M may include transparent material which may pass the ultraviolet rays. The mold pattern may have an inverted shape of the first preliminary pattern 210. For example, the imprint mold M may have a pattern including protrusion pattern having same shape disposed in uniform distances corresponding to the first preliminary pattern 210 which corresponds to a wire grid pattern. The protrusion pattern may have pitch from about 50 nm (nanometer) to 150 nm. The pitch may be defined as a sum of width of one protrusion pattern and a distance between adjacent protrusions.

The first resin solution 200 may be disposed in the first area A1, so that the first preliminary pattern 210 may be formed in the first area A1. During the first imprint process, a portion of the first resin solution 200 may be overflowed outside of the first area A1, forming a first overflowed portion 210a.

The first preliminary pattern 210 may include a residual layer disposed on the mask layer 120, and a plurality of protrusions disposed on the residual layer. Each of the protrusions of the first preliminary pattern 210 may be formed between the protrusion patterns of the mold pattern of the imprint mold M.

The ultraviolet rays may be radiated to the first preliminary pattern 210, and the resin solution of the first preliminary pattern 210 may be hardened. The imprint mold M may pass the ultraviolet rays, so the ultraviolet rays may be radiated onto the first preliminary pattern 210 through the imprint mold M. Thus, the resin solution of the first preliminary pattern 210 may be hardened. The first preliminary pattern 210 may be formed by separating the imprint mold M from the base substrate 100.

Figure 3B:
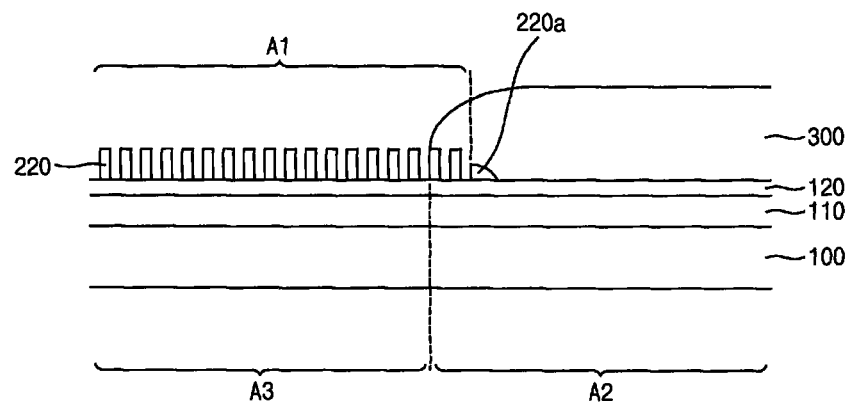

Referring to FIG. 3B, a first imprint pattern 220 may be formed by removing the residual layer of the first preliminary pattern 210. The first imprint pattern 220 may be formed in the first area A1. The first imprint pattern 220 may be formed by overall etching the first preliminary pattern 210 to remove the residual layer between the protrusions. The first overflowed portion 210a may also be partially removed during the etching process, so a first residual-overflowed portion 220a may be formed.

A first resist pattern 300 may be disposed in the second area A2 on the mask layer 120, on which the first imprint pattern 220 is formed. The first resist pattern 300 may cover a portion of the first imprint pattern 220 at a boundary of the first area A1 and the first residual-overflowed portion 220a. The second area A2 may be disposed adjacent to the first area A1, and a boundary of the second area A2 may overlap the boundary of the first area A1. Thus, the second area A2 may partially overlap the first area A1.

The first resist pattern 300 may be formed by disposing a photoresist layer on the mask layer 120, on which the first imprint pattern 220 is formed, and by exposing and developing the photoresist layer using an additional mask configured to leave a portion of the photoresist layer corresponding to the second area A2. For example, novolac photoresist may be used to form the first resist pattern 300. The first resist pattern 300 may have a thickness about 0.5 μm (micrometer) to about 4 μm. Accordingly, the first imprint pattern 220 in a third area A3 may be exposed. The third area A3 is a portion of the first area A1 that does not overlap the second area A2.

Figure 3C:
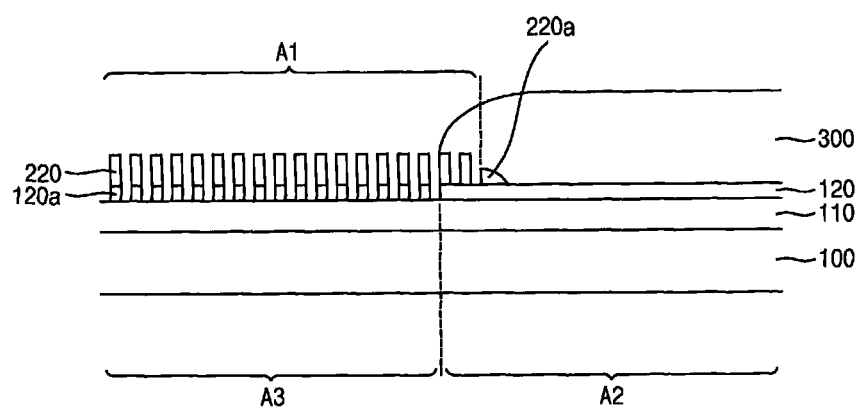

Referring to FIG. 3C, the mask layer 120 may be partially removed using the first imprint pattern 220 and the first resist pattern 300 as a mask. Accordingly, a mask pattern 120a may be formed in the third area A3. For example, the mask layer 120 may be dry etched using the first imprint pattern 220 and the first resist pattern 300 as an etch barrier. Here, the first resist pattern 300 covers the second area A2, so a portion of the mask layer 120 disposed in the second area A2 may be remained, and the mask layer 120 disposed in the third area A3 may be patterned into the mask pattern 120a. And then, the first imprint pattern 220 remaining in the third area A3 may be removed.

Figure 3D:
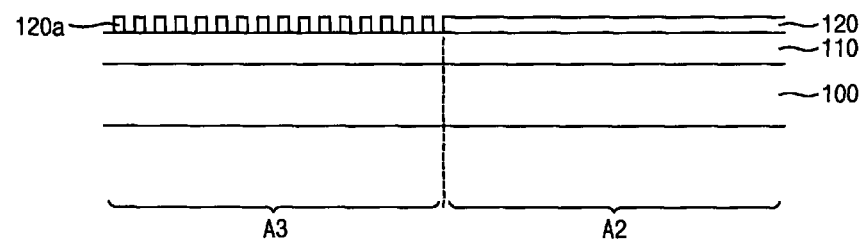

Referring to FIG. 3D, the first resist pattern 300, the first imprint pattern 220 remaining in the second area A2, and the first residual-overflowed portion 220a may be removed. Accordingly, the mask layer 120 disposed in the second area A2 may be exposed.

Figure 3E:
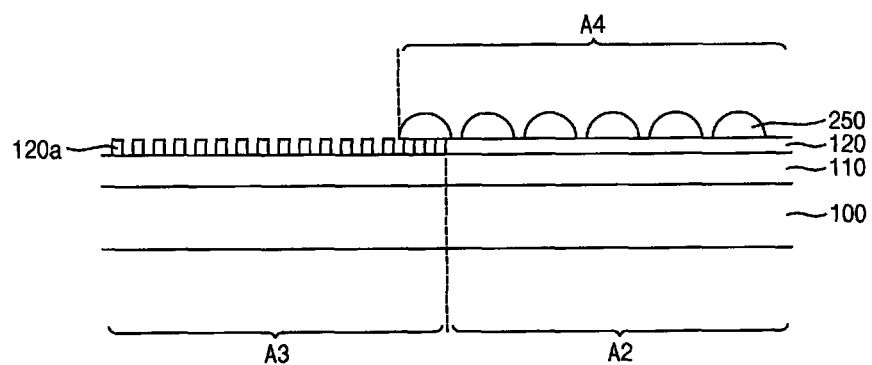

Referring to FIG. 3E, a second resin solution 250 may be disposed on the mask layer 120 in a fourth area A4. The second resin solution 250 may be disposed as a form of a plurality of droplets on the mask layer 120. For example, the second resin solution 250 may be dropped on the mask layer 120 by an ink jet method. The second resin solution 250 may be an ultraviolet ray curable resin composition having a relatively low viscosity.

The fourth area A4 may correspond to a portion of the base substrate 100. A second imprint process, which will be described later, may be performed in the fourth area A4. The fourth area A4 may overlap the second area A2. A boundary of the fourth area A4 may overlap a boundary of the third area A3. Thus, the fourth area A4 may partially overlap the third area A3.

Figure 3F:
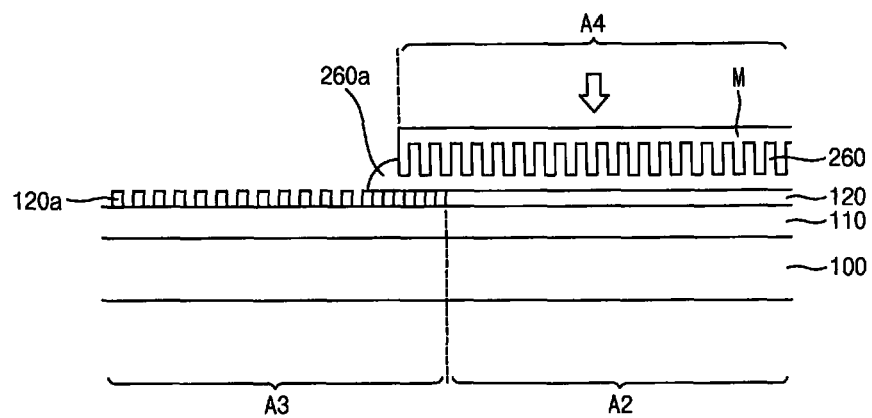

Referring to FIG. 3F, the second imprint process may be performed by moving the imprint mold M toward the base substrate 100, and the second resin solution 250 may be formed into a second preliminary pattern 260 by the imprint mold M. The second resin solution 250 has low viscosity, so that the second preliminary pattern 260 may be formed between the imprint mold M and the base substrate 100 due to the capillary action.

The imprint mold M may be substantially same as the imprint mold M of the first imprint process. The imprint mold M may have a size smaller than a size of a traditional wafer (300 mm). Accordingly, sum of the third area A3 and the second area A2 may have a size larger than that of the traditional wafer.

The second resin solution 250 may be disposed in the fourth area A4, so that the second preliminary pattern 260 may be formed in the fourth area A4. During the second imprint process, a portion of the second resin solution 250 may be overflowed outside of the fourth area A4, forming a second overflowed portion 260a.

The second preliminary pattern 260 may include a residual layer disposed on the mask layer 120, and a plurality of protrusions disposed on the residual layer. Each of the protrusions of the second preliminary pattern 260 may be formed between the protrusion patterns of the mold pattern of the imprint mold M.

The ultraviolet rays may be radiated to the second preliminary pattern 260 such that the resin solution of the second preliminary pattern 260 may be hardened. The imprint mold M may pass the ultraviolet rays, so the ultraviolet rays may be radiated onto the second preliminary pattern 260 through the imprint mold M. Thus, the resin solution of the second preliminary pattern 260 may be hardened. The second preliminary pattern 260 may be formed by separating the imprint mold M from the base substrate 100.

Figure 3G:
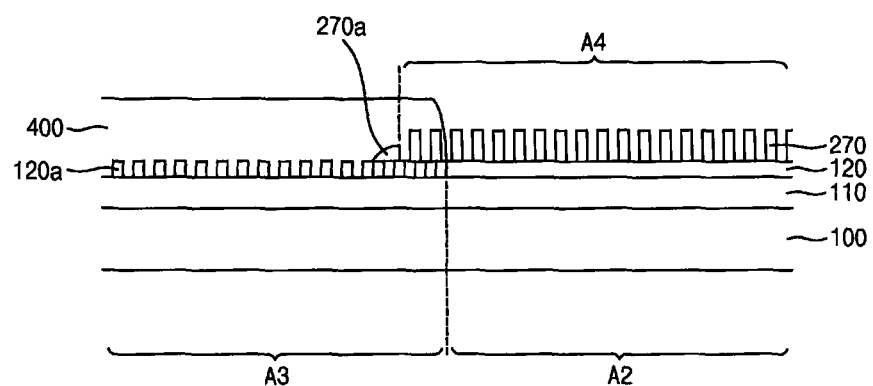

Referring to FIG. 3G, a second imprint pattern 270 may be formed by removing the residual layer of the second preliminary pattern 260. The second imprint pattern 270 may be formed in the fourth area A4. The second imprint pattern 270 may be formed by overall etching the second preliminary pattern 260 to remove the residual layer between the protrusions. The second overflowed portion 260a may also be partially removed during the etching process, so a second residual-overflowed portion 270a may be formed.

A second resist pattern 400 may be disposed in the third area A3 on the first layer 110, on which the second imprint pattern 270 is formed. The second resist pattern 400 may cover a portion of the second imprint pattern 270 at a boundary of the third area A3 and the second residual-overflowed portion 270a.

The second resist pattern 400 may be formed by disposing a photoresist layer on the mask layer 120, on which the second imprint pattern 270 is formed, and by exposing and developing the photoresist layer using an additional mask configured to leave a portion of the photoresist layer corresponding to the third area A3. For example, novolac photoresist may be used to form the second resist pattern 400. The second resist pattern 400 may have a thickness about 0.5 μm (micrometer) to about 4 μm. Accordingly, the second imprint pattern 270 in the second area A2 may be exposed. A boundary of the second resist pattern 400 may be aligned to a boundary between the third area A3 and the second area A2 by a precise alignment process.

Figure 3H:
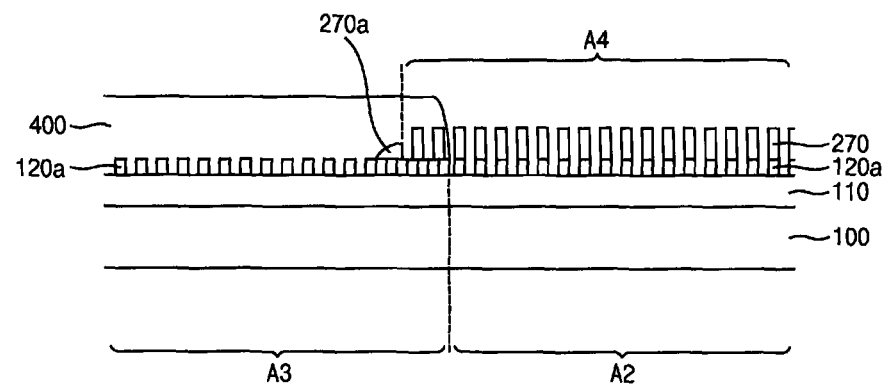

Referring to FIG. 3H, the mask layer 120 may be partially removed using the second imprint pattern 270 and the second resist pattern 400 as a mask. Accordingly, a mask pattern 120a may be formed in the second area A2. For example, the mask layer 120 may be dry etched using the second imprint pattern 270 and the second resist pattern 400 as an etch barrier. Here, the second resist pattern 400 covers the third area A3, so a portion of the mask layer 120 disposed in the third area A3 may be remained, and the mask layer 120 disposed in the second area A2 may be patterned into the mask pattern 120a. And then, the second imprint pattern 270 remaining in the second area A2 may be removed.

Figure 3I:
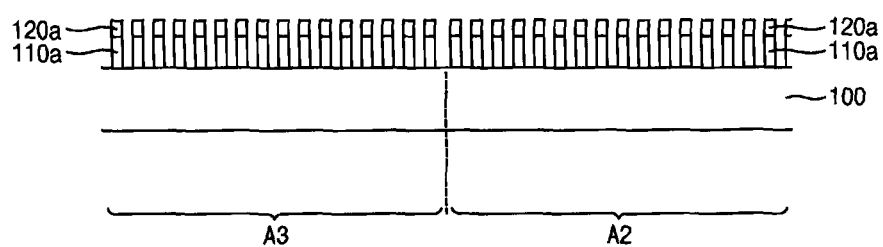

Referring to FIG. 3I, the second resist pattern 400, the second imprint pattern 270 remaining in the third area A3, and the second residual-overflowed portion 270a may be removed. And then, the first layer 110 may be partially removed using the mask pattern 120a as a mask. Accordingly, a first layer pattern 110a may be formed in the second and third area A2 and A3.

Accordingly, a master template for an imprint lithography process may be formed, which includes the first layer pattern 110a disposed on the base substrate 100. The master template may be used to perform a larger area imprint process which is larger than the imprint mold M. For example, the master template may be used to form an in-cell wire grid polarizer for a display panel.

Although the imprint mold M may generally have a size smaller than a traditional wafer (300 mm), the master template may have a size several times larger than the imprint mold M, and the large area imprint process may be performed using the master templet. Thus, the base substrate 100 of the master template may be larger than 300 mm.

During the first and second imprint processes, the boundary between the third area and the second area may be precisely aligned using a precise photoresist process. Thus, a pattern error at the boundary between the third area and the second area may be reduced.

In addition, the in-cell wire grid polarizer of a display apparatus may be directly formed using the exemplary method.

FIGS. 4A, 4B, 4C, 4D, 4E, 4F, and 4G are cross-sectional views illustrating an imprint lithography method according to an exemplary embodiment.

Figure 4A:
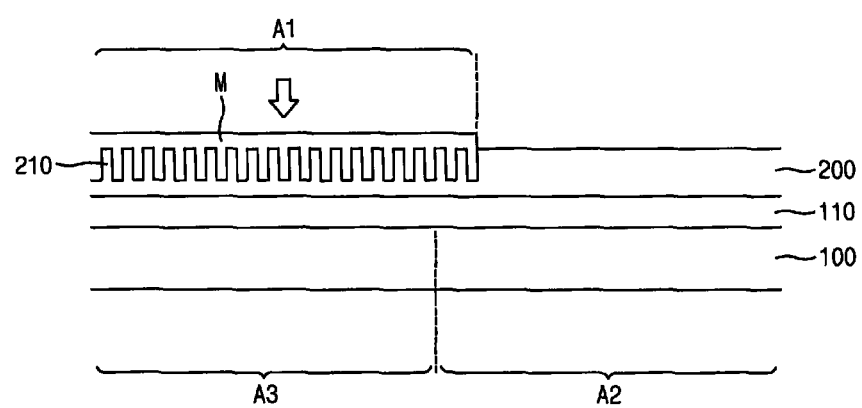
FIGS. 4A, 4B, 4C, 4D, 4E, 4F, and to 4G are cross-sectional views illustrating an imprint lithography method according to an exemplary embodiment.

Referring to FIG. 4A, a first layer 110 may be formed or otherwise disposed on a base substrate 100. The base substrate 100 may include a material having relatively high transmittance, thermal resistance, and chemical resistance. The first layer 110 may include a transparent material which passes ultraviolet rays. For example, the first layer 110 may include transparent silicon compound.

A first resin layer 200 may be formed or otherwise disposed on the first layer 110. For example, the first resin layer 200 may be formed on an entire surface of the first layer 110 using a spin coating process. The first resin layer 200 may be a transfer layer for an imprint process. The first resin layer 200 may include a traditional resin for an imprint process.

A first imprint process may be performed by moving an imprint mold M toward the base substrate 100, and a first preliminary pattern 210 may be formed from the first resin layer 200 in a first area A1 of the base substrate 100 by the imprint mold M.

The imprint mold M may have a mold pattern corresponding to the first area A1. The imprint mold M may include transparent material which may pass the ultraviolet rays. The mold pattern may have an inverted shape of the first preliminary pattern 210. For example, the imprint mold M may have a pattern including protrusion pattern having same shape disposed in uniform distances corresponding to the first preliminary pattern 210 which corresponds to a wire grid pattern. The protrusion pattern may have pitch from about 50 nm (nanometer) to 150 nm. The pitch may be defined as a sum of width of one protrusion pattern and a distance between adjacent protrusions.

The first preliminary pattern 210 may include a residual layer disposed on the first layer 110, and a plurality of protrusions disposed on the residual layer. Each of the protrusions of the first preliminary pattern 210 may be formed between the protrusion patterns of the mold pattern of the imprint mold M.

The ultraviolet rays may be radiated to the first preliminary pattern 210, and the first resin layer 200 and the first preliminary pattern 210 may be hardened. The imprint mold M may pass the ultraviolet rays, so the ultraviolet rays may be radiated onto the first preliminary pattern 210 through the imprint mold M. Thus, the resin of the first preliminary pattern 210 may be hardened.

Figure 4B:
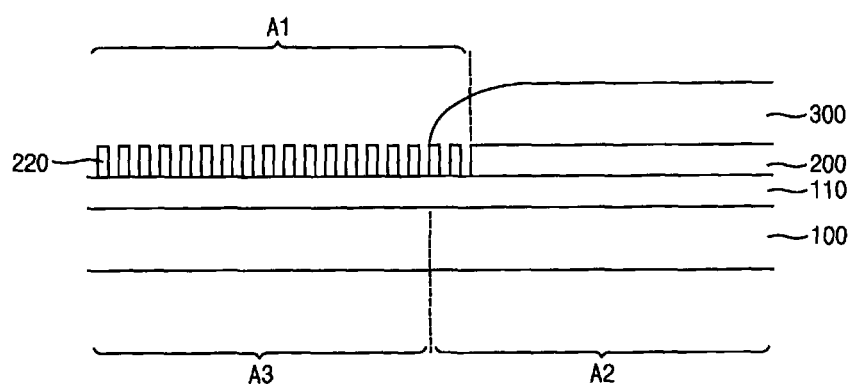

Referring to FIG. 4B, a first imprint pattern 220 may be formed by removing the residual layer of the first preliminary pattern 210. The first imprint pattern 220 may be formed in the first area A1. The first imprint pattern 220 may be formed by overall etching the first preliminary pattern 210 and the first resin layer 200 to remove the residual layer between the protrusions.

A first resist pattern 300 may be disposed in a second area A2 on the first resin layer 200, on which the first imprint pattern 220 is formed. The first resist pattern 300 may cover a portion of the first imprint pattern 220 at a boundary of the first area A1 and the first resin layer 200. The second area A2 may be disposed adjacent to the first area A1, and a boundary of the second area A2 may overlap the boundary of the first area A1. Thus, the second area A2 may partially overlap the first area A1.

The first resist pattern 300 may be formed by disposing a photoresist layer on the first resin layer 200 including the first imprint pattern 220 in the first area A1, and by exposing and developing the photoresist layer using an additional mask configured to leave a portion of the photoresist layer corresponding to the second area A2. For example, novolac photoresist may be used to form the first resist pattern 300. The first resist pattern 300 may have a thickness about 0.5 μm (micrometer) to about 4 μm. Accordingly, the first imprint pattern 220 in a third area A3 may be exposed. The third area A3 is a portion of the first area A1 that does not overlap the second area A2.

Figure 4C:
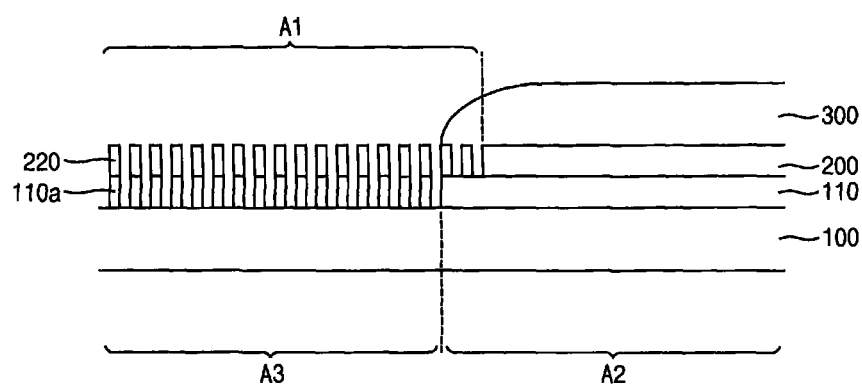

Referring to FIG. 4C, the first layer 110 may be partially removed using the first imprint pattern 220 and the first resist pattern 300 as a mask. Accordingly, a first layer pattern 110a may be formed in the third area A3. For example, the first layer 110 may be dry etched using the first imprint pattern 220 and the first resist pattern 300 as an etch barrier. Here, the first resist pattern 300 covers the second area A2, so a portion of the first layer 110 disposed in the second area A2 may be remained, and the first layer 110 disposed in the third area A3 may be patterned into the first layer pattern 110a. And then, the first imprint pattern 220 remaining in the third area A3 may be removed.

Figure 4D:
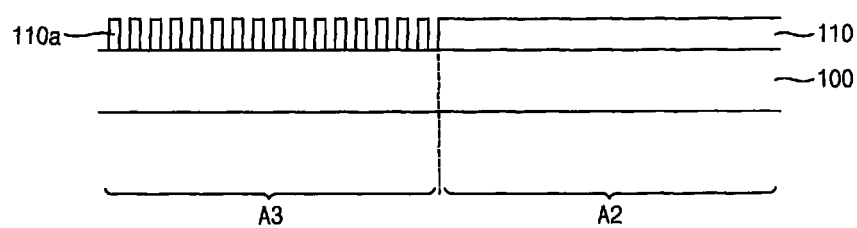

Referring to FIG. 4D, the first resist pattern 300, the first imprint pattern 220 remaining in the second area A2, and the first resin layer 200 may be removed. Accordingly, the first layer 110 disposed in the second area A2 may be exposed.

Figure 4E:
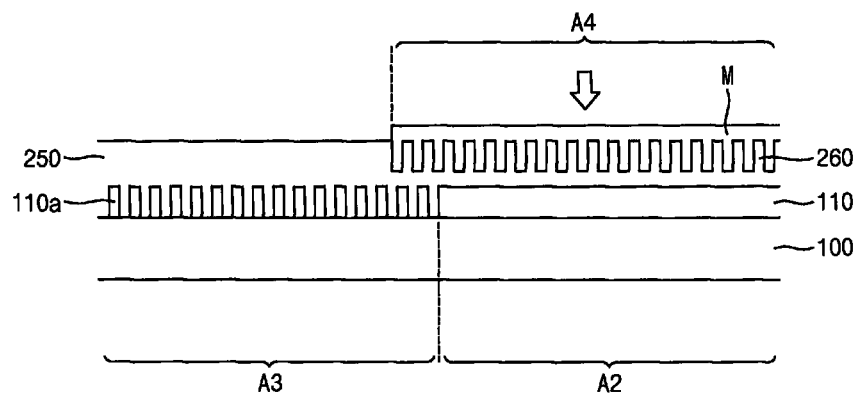

Referring to FIG. 4E, a second resin layer 250 may be disposed on the first layer 110 in a fourth area A4. For example, the second resin layer 250 may be formed on the first layer 110 using a spin coating process. The second resin layer 250 may be a transfer layer for an imprint process. The second resin layer 250 may include a traditional resin for an imprint process.

The fourth area A4 may correspond to a portion of the base substrate 100. A second imprint process, which will be mentioned later, may be performed in the fourth area A4. The fourth area A4 may overlap the second area A2. A boundary of the fourth area A4 may overlap a boundary of the third area A3. Thus, the fourth area A4 may partially overlap the third area A3.

The second imprint process may be performed by moving an imprint mold M toward the base substrate 100, and a second preliminary pattern 260 may be formed from the second resin layer 250 in the fourth area A4 of the base substrate 100 by the imprint mold M.

The imprint mold M may be substantially same as the imprint mold M of the first imprint process. The imprint mold M may have a size smaller than a size of a traditional wafer (300 mm). Accordingly, sum of the third area A3 and the second area A2 may have a size larger than that of the traditional wafer.

The second preliminary pattern 260 may include a residual layer disposed on the first layer 110, and a plurality of protrusions disposed on the residual layer. Each of the protrusions of the second preliminary pattern 260 may be formed between the protrusion patterns of the mold pattern of the imprint mold M.

The ultraviolet rays may be radiated to the second preliminary pattern 260, and the second resin layer 250 and the second preliminary pattern 260 may be hardened. The imprint mold M may pass the ultraviolet rays, so the ultraviolet rays may be radiated onto the second preliminary pattern 260 through the imprint mold M. Thus, the resin of the second preliminary pattern 260 may be hardened.

Figure 4F:
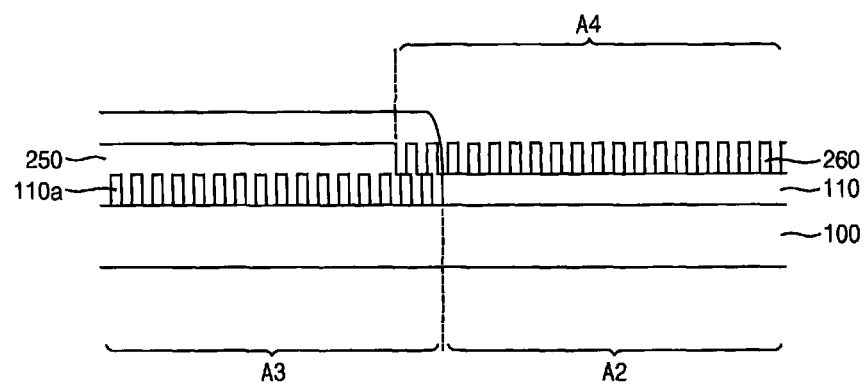

Referring to FIG. 4F, a second imprint pattern 270 may be formed by removing the residual layer of the second preliminary pattern 260. The second imprint pattern 270 may be formed in the fourth area A4. The second imprint pattern 270 may be formed by overall etching the second preliminary pattern 260 to remove the residual layer between the protrusions.

A second resist pattern 400 may be disposed in the third area A3 on the second resin layer 250, on which the second imprint pattern 270 is formed. The second resist pattern 400 may cover a portion of the second imprint pattern 270 at a boundary of the third area A3 and the second resin layer 250.

The second resist pattern 400 may be formed by disposing a photoresist layer on the first layer 110, on which the second imprint pattern 270 is formed, and by exposing and developing the photoresist layer using an additional mask configured to leave a portion of the photoresist layer corresponding to the third area A3. For example, novolac photoresist may be used to form the second resist pattern 400. The second resist pattern 400 may have a thickness about 0.5 µm (micrometer) to about 4 µm. Accordingly, the second imprint pattern 270 in the second area A2 may be exposed. A boundary of the second resist pattern 400 may be aligned to a boundary between the third area A3 and the second area A2 by a precise alignment process.

Figure 4G:
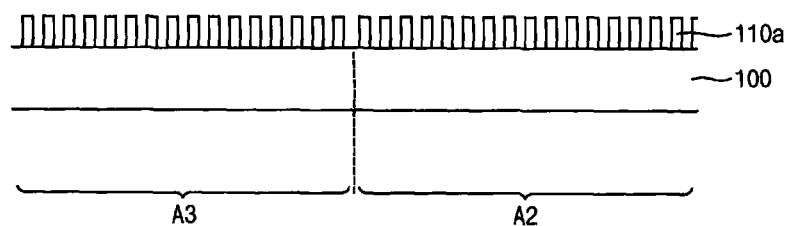

Referring to FIG. 4G, the first layer 110 may be partially removed using the second imprint pattern 270 and the second resist pattern 400 as a mask. Accordingly, a first layer pattern 110a may be formed in the second area A2. For example, the first layer 110 may be dry etched using the second imprint pattern 270 and the second resist pattern 400 as an etch barrier. Here, the second resist pattern 400 covers the third area A3, so a portion of the first layer 110 disposed in the third area A3 may be remained, and the first layer 110 disposed in the second area A2 may be patterned into the first layer pattern 110a. Then, the second imprint pattern 270 remaining in the second area A2, a second resist pattern 400, the second resin layer 250 may be removed.

Accordingly, a master template for an imprint lithography process, which includes the first layer pattern 110a disposed on the base substrate 100, may be formed. The master template may be used to perform a larger area imprint process which is larger than the imprint mold M. For example, the master template may be used to form an in-cell wire grid polarizer for a display panel.

FIGS. 5A, 5B, 5C, 5D, 5E, and 5F are cross-sectional views illustrating an imprint lithography method according to an exemplary embodiment.

Figure 5A:
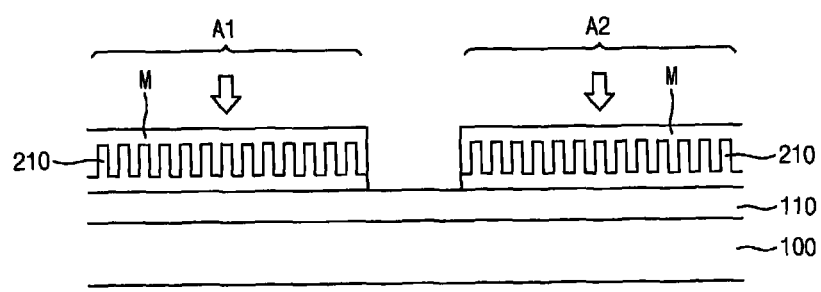
FIGS. 5A, 5B, 5C, 5D, 5E, and to 5F are cross-sectional views illustrating an imprint lithography method according to an exemplary embodiment.

Referring to FIG. 5A, a first layer 110 may be formed or otherwise disposed on a base substrate 100. A first preliminary pattern 210 may be formed on the first layer 110 in a first area A1 and a second area A2. The first preliminary pattern 210 may be formed by disposing resin solution on the first layer 110 and using an imprint mold M. The first preliminary pattern 210 disposed in the first area A1 and the first preliminary pattern 210 disposed in the second area A2 may be respectively formed at the same time or may be formed sequentially.

Figure 5B:
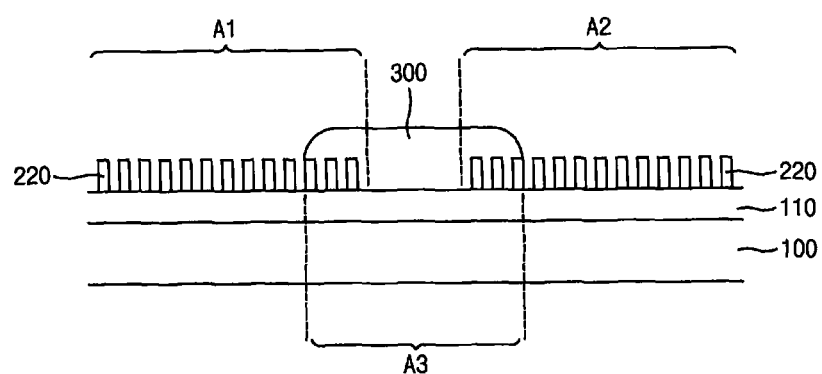

Referring to FIG. 5B, a first imprint pattern 220 may be formed by overall etching the first preliminary pattern 210. And then, a first resist pattern 300 may be formed in a third area A3 covering the first layer 110 and the first imprint pattern 220 disposed in the third area A3. The third area A3 is disposed between the first area A1 and the second area A2, and partially overlaps the first area A1 and the second area A2. Here, the first area A1 may have a size substantially same as a size of the second area A2. The third area A3 may be smaller than the first area A1 and the second area A2.

Figure 5C:
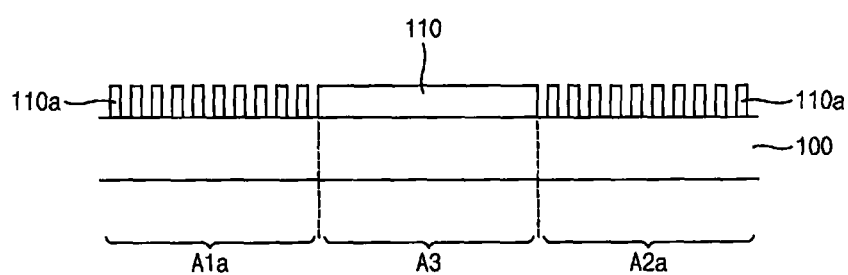

Referring to FIG. 5C, the first layer 110 may be partial etched using the first imprint pattern 220 and the first resist pattern 300 as an etch barrier. Accordingly, the first layer 110 may be formed in a 1-a area A1a and a 2-a area A2a. The 1-a area A1a is a portion of the first area A1 that is not overlapping with the third area A3. The 2-a area A2a is a portion of the second area A2 that is not overlapping with the third area A3. Here, the 1-a area A1a, the 2-a area A2a and the third area A3 may each have sizes substantially the same or similar to each other.

Figure 5D:
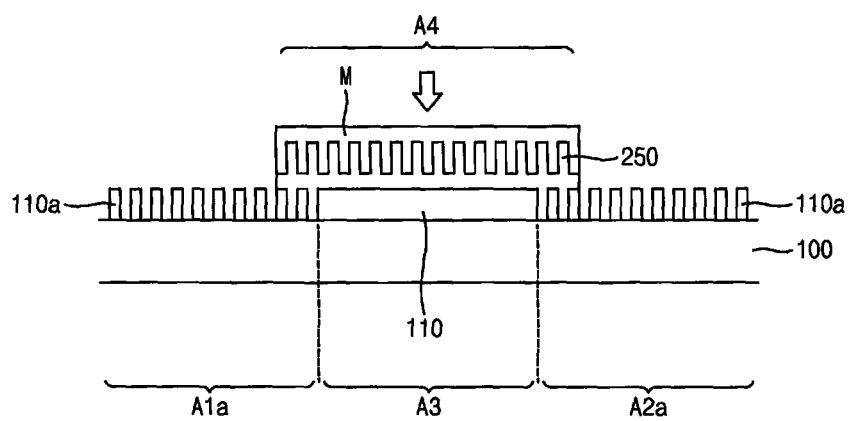

Referring to FIG. 5D, a second preliminary pattern 260 may be formed on the first layer 110 in a fourth area A4. The second preliminary pattern 260 may be formed by disposing resin solution of the first layer 110 and using the imprint mold M. Here, the fourth area A4 is disposed overlapping the third area A3, and a portion of the 1-a area A1a and a portion of the 2-a area A2a.

Figure 5E:
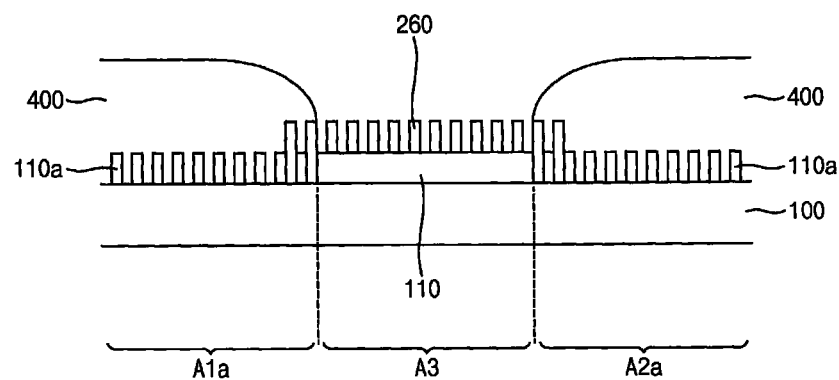

Referring to FIG. 5E, a second imprint pattern 270 may be formed by overall etching the second preliminary pattern 260. And then a second resist pattern 400 may be formed in the 1-a area A1a and the 2-a area A2a to cover the first layer pattern 110a and the second imprint pattern 270.

Figure 5F:
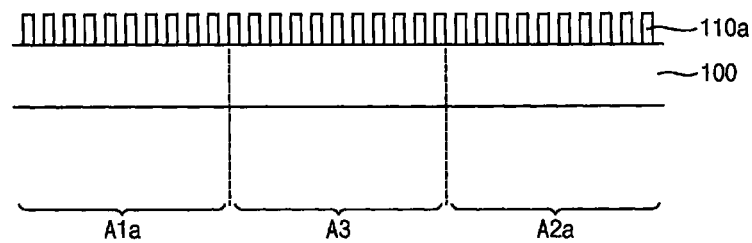

Referring to FIG. 5F, the first layer 110 may be partially etched using the second imprint pattern 270 and the second resist pattern 400 as an etch barrier. Accordingly, the first layer 110 may be disposed in the third area A3. Accordingly, the first layer pattern 110a which is larger than the imprint mold M may be formed on the base substrate 100.

According to the exemplary embodiments of the present inventive concept, a portion of a first imprint pattern may be overlapped with a portion of a second imprint pattern, so that large area imprint process larger than an imprint mold may be possible.

In addition, alignment between the first imprint pattern and the second imprint pattern may be performed by a photoresist process, so that accurate alignment may be possible by a precise photoresist process.

In addition, a seamless master template for a large area imprint lithography method may be provided using the method.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An imprint lithography method of forming a pattern, the method comprising:
   forming a first imprint pattern on a base substrate in a first area;
   forming a first resist pattern on the base substrate in a second area, the second area partially overlapping the first area;
   etching a third area using the first imprint pattern and the first resist pattern as an etch barrier to form the pattern in the third area, wherein the third area is a portion of the first area that is not overlapped with the second area;

removing the first imprint pattern and the first resist pattern;

forming a second imprint pattern on the base substrate in a fourth area which overlaps the second area and partially overlaps the pattern in the third area;

forming a second resist pattern on the base substrate in the third area; and etching the second area using the second imprint pattern and the second resist pattern as an etch barrier to form the pattern in the second area.

2. The imprint lithography method of claim 1, wherein the first resist pattern is disposed covering a portion of the first imprint pattern disposed in the second area.

3. The imprint lithography method of claim 1, wherein a boundary of the second resist pattern is aligned to a boundary between the second area and the third area.

4. The imprint lithography method of claim 1, wherein etching the third area comprises:

forming an engraved pattern in the base substrate in the third area by directly etching the base substrate in the third area, and wherein etching the second area comprises:

forming the engraved pattern in the base substrate in the second area by directly etching the base substrate in the second area.

5. The imprint lithography method of claim 1, wherein the first area comprises at least two sub areas disposed spaced apart from each other, and wherein the second area is disposed between the two sub areas, and partially overlapping both of the two sub areas.

6. The imprint lithography method of claim 1, wherein the forming the first imprint pattern comprises:

disposing a resin layer on the base substrate; and forming the first imprint pattern on the resin layer in the first area using an imprint mold.

7. The imprint lithography method of claim 6, wherein the resin layer is disposed to entirely cover the base substrate.

8. The imprint lithography method of claim 1, wherein each of the first and second resist patterns has a thickness about 0.5 µm (micrometer) to about 4 µm.

9. The imprint lithography method of claim 8, wherein the first and second resist pattern comprises novolac photoresist.

10. The imprint lithography method of claim 1 further comprising:

disposing a first layer between the base substrate and the first imprint pattern.

11. The imprint lithography method of claim 10, wherein the first layer comprises a transparent material, and wherein the pattern is formed in the first layer.

12. The imprint lithography method of claim 11 further comprising:

disposing a mask layer between the first layer and the first imprint pattern; and etching the first layer using a mask pattern formed in the mask layer as an etching mask, wherein etching the third area comprises:

forming the mask pattern in the etch barrier in the third area by etching the etch barrier in the third area, and wherein etching the second area comprises:

forming the mask pattern in in the etch barrier of the second area by etching the etch barrier in the second area.

13. The imprint lithography method of claim 1, wherein the forming the first imprint pattern comprises:

disposing droplets of a first resin solution on the base substrate in the first area;

forming a first preliminary pattern from the first resin solution using an imprint mold; and hardening the first resin solution by radiating ultraviolet rays onto the first preliminary pattern.

14. The imprint lithography method of claim 13, wherein the first preliminary pattern comprises a residual layer disposed on the base substrate and a plurality of protrusions disposed on the residual layer, and wherein the forming the first imprint pattern further comprises removing the residual layer disposed between the protrusions by overall etching the first preliminary pattern.

15. The imprint lithography method of claim 14, wherein the first imprint pattern further comprises a first overflowed portion, the first overflowed portion is formed by the first resin solution overflowed to outside of the first area.

16. The imprint lithography method of claim 15, wherein the first resist pattern is disposed covering the first overflowed portion.

17. A manufacturing method of a master template comprising a master pattern for imprint lithography, comprising:

forming a first imprint pattern on a base substrate in a first area using an imprint mold;

forming a first resist pattern on the substrate in a second area, the second area partially overlapping the first area;

etching a third area using the first imprint pattern and the first resist pattern as an etch barrier to form the master pattern in the third area, wherein the third area is a portion of the first area that is not overlapped with the second area;

removing the first imprint pattern and the first resist pattern;

forming a second imprint pattern on the base substrate in a fourth area which overlaps the second area and partially overlaps the master pattern in the third area;

forming a second resist pattern on the base substrate in the third area; and etching the second area using the second imprint pattern and the second resist pattern as an etch barrier to form the master pattern in the second area, and wherein the base substrate is larger than the imprint mold.

18. The manufacturing method of claim 17, wherein a boundary of the second resist pattern is aligned to a boundary between the second area and the third area.

* * * * *